United States Patent [19]

Tateishi

[11] Patent Number: 5,045,812
[45] Date of Patent: Sep. 3, 1991

[54] PLL CIRCUIT FOR PRODUCING A CLOCK SIGNAL

[75] Inventor: Kiyoshi Tateishi, Tokorozawa, Japan

[73] Assignee: Pioneer Electronic Corporation, Tokyo, Japan

[21] Appl. No.: 571,065

[22] Filed: Aug. 23, 1990

[30] Foreign Application Priority Data

Jan. 16, 1990 [JP] Japan ................................. 2-8002

[51] Int. Cl.⁵ .................... H03L 7/107; G11B 19/28
[52] U.S. Cl. ...................................... 331/10; 331/16; 331/17; 360/73.03
[58] Field of Search .................. 331/10, 15, 16, 17, 331/18, 25; 329/302, 325; 375/120; 360/73.01, 73.03, 73.05; 369/44.25, 44.35, 44.36

[56] References Cited

U.S. PATENT DOCUMENTS 4,024,464 5/1977 Underhill et al. ................. 331/10

Primary Examiner—David Mis
Attorney, Agent, or Firm—Sughrue, Mion, Zinn, Macpeak & Seas

[57] ABSTRACT

A PLL circuit for use in a disk playing apparatus is constructed such that an oscillation output of a VCO is frequency divided at a frequency dividing ratio corresponding to a designated linear velocity in the disk playing apparatus. The frequency divided signal is derived as a reproduction clock signal and a gain of a variable gain amplifier which amplifies a phase error signal and uses the amplified signal as a control voltage of the VCO is changed in accordance with the designated linear velocity, so that a stable loop characteristic is always obtained.

1 Claim, 2 Drawing Sheets

PLL CIRCUIT FOR PRODUCING A CLOCK SIGNAL

BACKGROUND OF THE INVENTION

1. Field of the Invention

The present invention relates to a PLL (phase locked loop) circuit for producing a clock signal and more particularly to a PLL circuit for producing a clock signal which is synchronized in phase with a clock component contained in the read signal from a disk and for deriving it as a reproduction clock signal

2. Description of Background Information

As a method of recording information to a disk-shaped recording medium, a CAV (constant angular velocity) method and a CLV (constant linear velocity) method are known The disk based on the CLV recording method (hereinafter, simply referred to as a CLV disk) has an advantage such that it is possible to record information of an amount which is about twice as large as that in the case of the disk based on the CAV recording method. Therefore, the CLV recording method is used in a digital audio disc called a CD (compact disc) and a CD-ROM whose fundamental recording format is the same as that of the CD and which is used as a recording medium of digital data To read the recorded information from the CLV disk, it is necessary to produce clocks which are synchronized in phase with the clock component included in the read signal from the disk. A PLL circuit is widely used to produce such clocks In recent years, to promptly read out desired data from the CD-ROM, the development of the high-speed access of the CD-ROM is in progress. However, even if the accessing speed is made higher, in handling data of a large amount such as data of image information or the like, it takes a relatively long time to read the data, and a limitation is imposed in reducing the total time which is required to read out the data. Therefore, it is necessary to raise the speed of reading the recorded information from the CD-ROM. To raise the reading speed of the recorded information from the CD-ROM, the recorded information needs to be read out at a higher speed, for instance, at a linear velocity faster than the ordinary linear velocity by two times, four times, or the like.

As mentioned above, in reading the recorded information at a linear velocity which is twice, four times, or the like faster than the ordinary linear velocity in order to realize the high speed reading of the data from the CD-ROM, an oscillating frequency of a VCO (voltage controlled oscillator) in the PLL circuit for producing clocks also should be changed in accordance with the linear velocity For this purpose, a method is conceivable wherein a plurality of VCOs of the oscillating frequencies corresponding to the linear velocities are provided and switched over in accordance with the linear velocity. However, with such method the circuit construction becomes complicated and also the cost becomes high.

OBJECT AND SUMMARY OF THE INVENTION

It is, therefore, an object of the invention to provide a PLL circuit for producing clocks, which can operate at different in linear velocities, with a simple circuit construction, and which can be produced at low cost.

According to the present invention a PLL circuit for producing clocks is provided for use in a disk playing apparatus which has designating means for designating a predetermined linear velocity and reads recorded information from a disk at the linear velocity designated by the designated means. The PLL circuit produces clocks which are synchronized in phase with the clock component contained in a read signal from the disk, the produced clocks being derived as reproduction clocks, wherein the PLL circuit comprises: a VCO having a predetermined center frequency; frequency dividing means for frequency dividing an oscillation output of the VCO at a frequency dividing ratio corresponding to the designated linear velocity and for outputting the frequency divided signal as the reproduction clocks; phase comparing means for generating a phase error signal corresponding to a phase difference between the clock component in the read signal and the reproduction clock signal; and a variable gain amplifier which amplifies the phase error signal thereby to obtain a control voltage of the VCO and whose gain is variable with the designated linear velocity.

In the PLL circuit for producing clocks according to the invention, the oscillation output of the VCO is frequency divided at a frequency dividing ratio corresponding to the designated linear velocity and the frequency divided signal is derived as reproduction clocks. The gain of the variable gain amplifier, which amplifies the phase error signal corresponding to the phase difference between the reproduction clocks and the clock component in the read signal and uses the phase error signal as a control voltage of the VCO, is changed in accordance with the designated linear velocity.

DETAILED DESCRIPTION OF THE PREFERRED EMBODIMENT

An embodiment of the present invention will be described in detail hereinafter with reference to the drawings.

Figure 1:
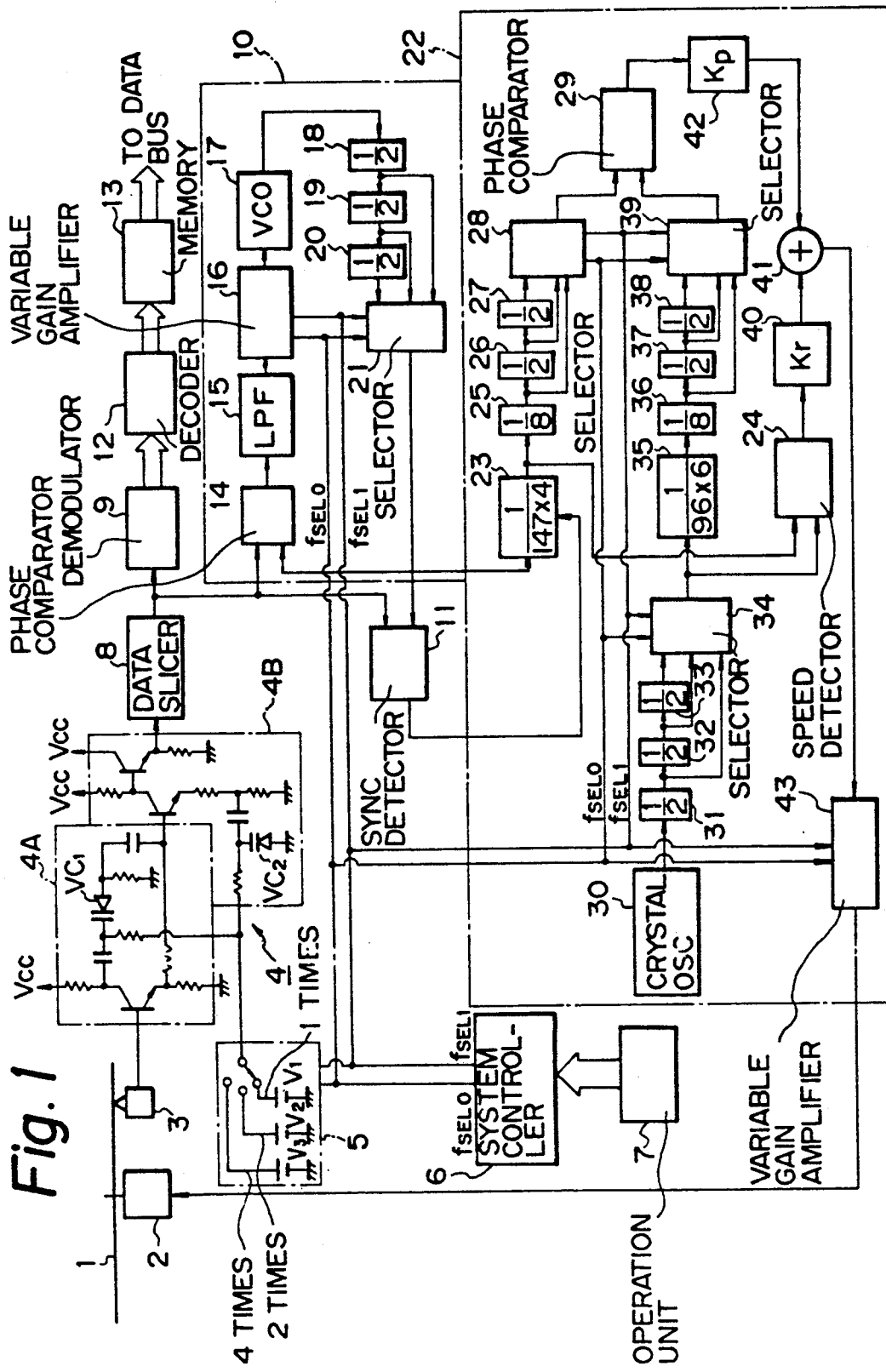
FIG. 1 is a block diagram partially in the form of a circuit diagram, showing an embodiment of a disk playing apparatus including a PLL circuit for producing clocks according to the present invention.

In FIG. 1, digital data is recorded on a disk 1 by using, for instance, an EFM (Eight to Fourteen Modulation) method. With respect to the recording, it is known that there occurs what is called a pattern peak shift phenomenon such that, as a result of the improvement in the linear recording density, recording patterns before and after the recording pattern being scanned give interferences to the reproduction signal, which in turn causes a phase shift of the reproduction signal. The disk 1 is rotated by a spindle motor 2 and recorded information on the disk is read by an optical pickup 3. The pickup 3 is supported by a slider (not shown) which is provided so as to be movable in the radial direction of the disk. A read RF signal which is output from the pickup 3 is supplied to an RF compensating circuit 4.

The RF compensating circuit 4 comprises a phase shifting circuit 4A for correcting the phase shift of the read RF signal which is caused due to the aforementioned pattern peak shift phenomenon and, thereby compensating the phase characteristics of the RF signal, and a high frequency emphasizing circuit 4B for correcting the attenuation amount of the high frequency component in the read RF signal due to an aperture effect of a information reading light spot of the pickup 3 and, thereby for compensating the frequency characteristics of the RF signal. The compensating characteristics of both circuits 4A and 4B are made variable. Specifically, the phase shifting circuit 4A and the high frequency emphasizing circuit 4B respectively have variable capacity diodes VC1 and VC2, and are constructed so that the compensating characteristics thereof the circuits 4A and 4B change in accordance with values of control voltages $v_1$ to $v_3$ ($v_1 < v_2 < v_3$) which are applied as bias voltages to the variable capacity diodes $VC_1$ and $VC_2$. Either one of the control voltages $v_1$ to $v_3$ for changing the compensating characteristics is selectively issued from a control voltage generating circuit 5 in accordance with the content of a control code which is issued from a system controller 6.

The system controller 6 is constituted, for instance, by a microcomputer. When any one of three levels of the linear velocities such as the reference linear velocity (one time), a linear velocity which is twice as fast as the reference linear velocity, and a linear velocity which is four times as fast as the reference linear velocity is designated in an operation unit 7 as a linear velocity for reading information, the system controller 6 issues control codes $fSEL_0$ and $fSEL_1$ corresponding to the designated linear velocity. The contents of the control codes $fSEL_0$ and $fSEL_1$ are defined, for example, as shown in the following table.

TABLE

| linear velocity | 4 times | 2 times | 1 time |
|---|---|---|---|
| $fSEL_0$ | 0 | 1 | 0 |
| $fSEL_1$ | 0 | 0 | 1 |

The RF signal whose phase and frequency characteristics are compensated by the RF compensating circuit 4 is waveform shaped and converted into the square wave pulse by a data slicing circuit 6. After that, the square wave pulse is supplied to a demodulating circuit 9, a PLL circuit 10 for producing clocks according to the invention, and a synchronization detecting circuit 11, respectively. The demodulating circuit 9 executes a demodulating process of the EFM signal in the form of the square wave pulse and an error detection and correction operation, thereby demodulating the data. The demodulated data is decoded by a decoder 12 and converted into image data and various control data. These data are once written into a buffer memory 13, and in turn transferred to a data bus (not shown) at a high speed.

The clock producing PLL circuit 10 according to the invention extracts the clock component in the EFM signal series and produces pulses of a predetermined frequency synchronized with the extracted clock component and outputs as reproduction clocks. Specifically, there is provided a phase comparator 14 for comparing phases of the EFM signal of the square wave pulse and the reproduction clocks. The low frequency component in a comparison output signal passes through an LPF (low pass filter) 15, so that a phase error signal is derived therefrom. The phase error signal is amplified by a variable gain amplifier 16 and is used as a control voltage of a VCO 17. A center oscillating frequency $f_0$ of the VCO 17 is set at, for instance, 34.5744 MHz. The variable gain amplifier 16 is configured so that its gain changes among values of +12 dB, +6 dB, and 0 dB for the linear velocities of one time, twice, and four times the normal velocity respectively, in accordance with the contents of the control codes $fSEL_0$ and $fSEL_1$ which are supplied from the system controller 6. The clock signal which is output from the VCO 17 are frequency divided into an ⅛ of the original frequency by means of three ½ frequency dividers 18 to 20, which are connected in series, and is supplied to one input terminal of a 3-input selector 21. On the other hand, the clocks from the VCO 17 is frequency divided into a ¼ of the original frequency by means of the ½ frequency dividers 18 and 19 and is input to another input terminal of the selector 21. The clock signal from the VCO 17 are further frequency divided into a ½ of the original frequency by means of the ½ frequency divider 18 and are supplied to the other remaining input terminal of the selector 21. The selector 21 selectively outputs one of the clocks, as a reproduction clock, which were frequency divided to ⅛, ¼, and ½ of original frequency for the linear velocities of one time, two times, and four times the normal velocity respectively on the basis of the contents of the control codes $fSEL_0$ and $fSEL_1$ supplied from the system controller 6. The reproduction clock is supplied to the synchronization detecting circuit 11 and a CLV servo circuit 22.

In the clock producing PLL circuit 10 with the above-described construction, the oscillating frequency of the VCO 17 is set to 34.5744 MHz, the output clocks are frequency divided at the frequency dividing ratio corresponding to the designated linear velocity, and the reproduction clocks of the frequencies of 4.3218 MHz, 8.6436 MHz, and 17.2872 MHz are obtained for the designated linear velocities of one time, twice, and four times the normal velocity. Thus, it is possible to deal with a change in designated linear velocity by using a single VCO 17.

Figure 2:
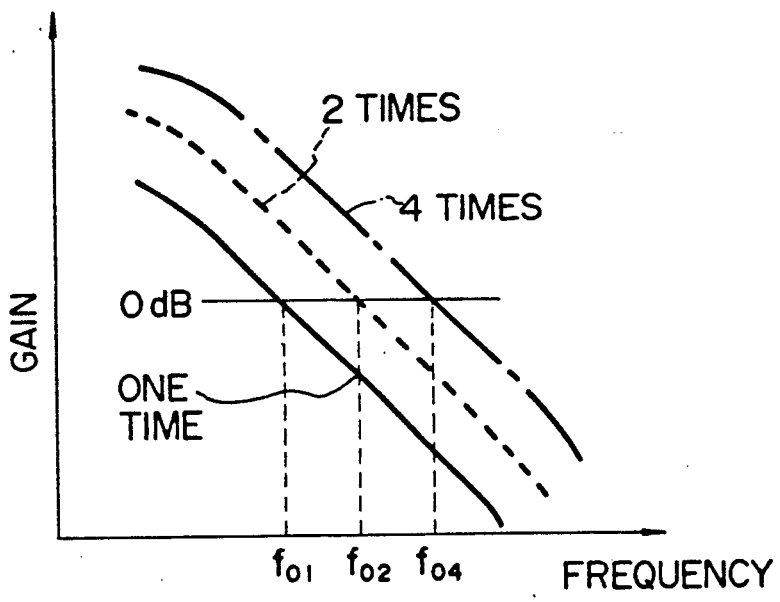
FIG. 2 is a loop characteristic diagram showing a state in which the gain of a variable gain amplifier in FIG. 1 is fixed at 0 dB.

However, since the frequency dividing ratios differ from each other, if the gain of the variable gain amplifier 16 arranged at the post stage of the LPF 15 is fixed, for example, at 0 dB, a sensitivity of the VCO at a stage after the selector 21 becomes −6 dB for the liner velocity of twice the normal velocity and becomes −12 dB for the linear velocity of one time the normal velocity with respect to the sensitivity for the linear velocity of four times the normal velocity. For this reason, in the case of the linear velocities of two times and one time the normal velocity, the loop band width is reduced to ½ and ¼ of the band width obtained with the designated linear velocity of four times the normal velocity, as shown in FIG. 2. Thus, an eccentricity tracing capability of the apparatus will be deteriorated and on the other hand a reading error rate of the data will be increased.

Figure 3:
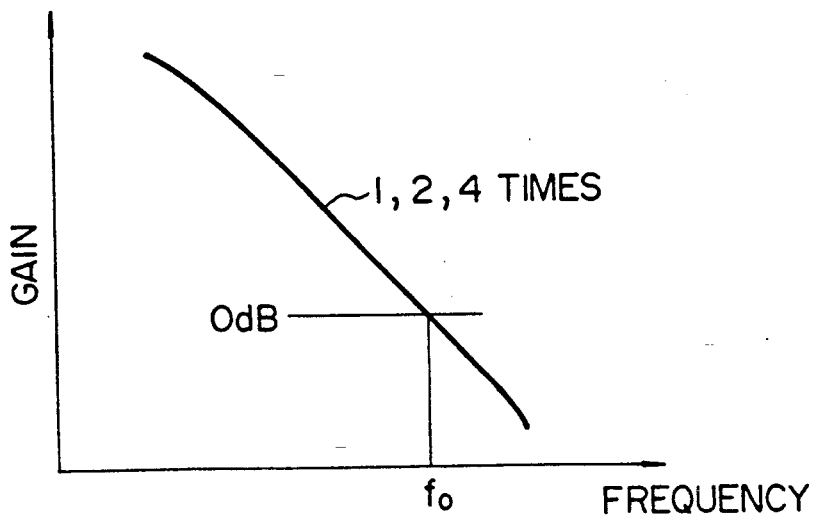
FIG. 3 is a loop characteristic diagram when the gain of the variable gain amplifier in FIG. 1 is changed correspondingly to a designated linear velocity.

However, according to the invention, the gain of the variable gain amplifier 16 is changed correspondingly to the designated linear velocity. With respect to the value at the designated linear velocity four times the normal velocity, gains in the case of the linear velocities of twice and one time are raised by +6 dB and +12 dB respectively. Therefore, as shown in FIG. 3, the loop gain becomes constant irrespective of the change in linear velocity and the optimum loop band width can be assured for each of the designated linear velocities. Consequently, an increase in data reading error rate due to the eccentricity can be prevented.

The synchronization detecting circuit 11 extracts the sync signal inserted during the recording by the reproduction clocks from the EFM signal of the square wave pulse and issues the extracted sync signal as a reproduction sync signal.

In the CLV servo circuit 22, the reproduction clocks from the PLL circuit 10 are frequency divided into $1/(147 \times 4)$ by a frequency divider 23 which is reset by the reproduction sync signal from the synchronization detecting circuit 11. The frequency divided clock signal becomes pulses of a duty ratio of 50 % which are synchronized with the reproduction sync signal and is used as a writing clock signal of the memory 13 mentioned above. On the other hand, the writing clock signal is supplied to one input terminal of a speed detector 24. The writing clock signal is frequency divided into an ½ of the original frequency by an ½ frequency divider 25 and is supplied to one input terminal of a 3-input selector 28. The frequency divided clock signal is further transmitted through a ½ frequency divider 26 and frequency divided into 1/16 of the original frequency and supplied to another input terminal of the selector 2S. Then, the frequency divided clock signal is further transmitted through a ½ frequency divider 27 and frequency divided into a 1/32 of the original frequency and supplied to the other remaining input terminal of the selector 28.

On the basis of the contents of the control codes fSEL$_0$ and fSEL$_1$ which are supplied from the system controller 6, the selector 28 outputs the clocks which were frequency divided into ½, 1/16, and 1/32 of the original frequency for the linear velocities of one time, twice, and four times the normal velocity, respectively.

The frequency divided clocks are selectively supplied to one input terminal of a phase comparator 29.

On the other hand, a clock signal of 33.6688 MHz is issued from a crystal oscillator 30 as a reference sync signal. The reference clock signal is frequency divided into an ½ of the original frequency by means of three ½ frequency dividers 31 to 33, which are connected in series, and is supplied to one input terminal of a 3-input selector 34. The clock signal is then frequency divided into a ¼ of the original frequency by means of the ½ frequency dividers 31 and 32 and supplied to another input terminal of the selector 34. The clock signal is further frequency divided into ½ of the original frequency by means of the ½ frequency divider 31 and supplied to the other remaining input terminal of the selector 34.

On the basis of the contents of the control codes fSEL$_0$ and fSEL$_1$ which are supplied from the system controller 6, the selector 34 issues one of the clock signals, as a master clock, which is obtained as ⅛, ¼, or ½ of the original frequency respectively for the linear velocities of one time, twice, and four times the normal velocity. The master clock is supplied to the other input terminal of the speed detector 24 and is frequency divided into $1/(96 \times 6)$ of the original frequency by a frequency divider 35 and used as a reading clock signal of the memory 13 mentioned above.

The reading clock signal is frequency divided into ½ of the original frequency by an ½ frequency divider 36 and supplied to one input terminal of a 3-input selector 39. The reading clock signal is further transmitted through a ½ frequency divider 37 and frequency divided into a 1/16 of the original frequency and supplied to another input terminal of the selector 39. The reading clock signal is further transmitted through a ½ frequency divider 38 and frequency divided into a 1/32 of the original frequency and supplied to the other remaining input terminal of the selector 39. On the basis of the contents of the control codes fSEL$_0$ and fSEL$_1$ which are supplied from the system controller 6, the selector 39 issues respectively the clock signals ½, 1/16, and 1/32 of the original frequency for the linear velocities of one time, two times, and four times the normal velocity, respectively.

The clock signal is supplied to the other input terminal of the phase comparator 29.

The speed detector 24 outputs a speed error signal of a pulse width corresponding to the frequency difference between the master clocks and the write clocks.

The speed error signal is multiplied with a coefficient $K_v$ by a coefficient multiplier 40 and supplied to one input terminal of an adder 41. On the other hand, the phase comparator 29 issues a phase error signal having a pulse width corresponding to the phase difference between the clock signals from the selectors 28 and 39, that is, the phase difference between the writing clock signal and the frequency divided clock signal which is obtained by frequency dividing the master clock at a frequency dividing ratio corresponding to the designated linear velocity. The phase error signal is multiplied with a coefficient $K_p$ by a coefficient multiplier 42 and supplied to the other input terminal of the adder 41. The adder 41 adds the speed error signal multiplied with the coefficient $K_v$ and the phase error signal multiplied with the coefficient $K_p$ together and issues the result as a spindle error signal. The spindle error signal is transferred through a variable gain amplifier 43 and supplied to the spindle motor 2. The gain of the variable gain amplifier 43 is changed over among 0 dB, +6 dB, and +12 dB for the linear velocities of one time, twice, and four times the normal velocity in accordance with the contents of the control codes fSEL$_0$ and fSEL$_1$ which are supplied from the system controller 6.

The rotational speed of the disk 1 is controlled by the CLV servo circuit 22 with the above construction in a manner such that the linear velocity becomes constant and is set to the linear velocity designated by the operation unit 7.

In the embodiment, the frequency dividers 18 to 20 for frequency dividing the output pulses of the VCO 17, the frequency dividers 25 to 27 for frequency dividing the write clocks, the frequency dividers 31 to 33 for frequency dividing the output clocks of the crystal oscillator 30, and the frequency dividers 36 to 38 for frequency dividing the read clocks are respectively serially connected at three stages, thereby obtaining the clock signals having the frequencies corresponding to the designated linear velocities. However, a frequency divider having a frequency dividing ratio corresponding to the designated linear velocity may be also connected in parallel with each selector and the clock signals of the frequencies corresponding to the designated linear velocities can be similarly obtained.

As described above, in the clock producing PLL circuit according to the invention, the oscillation output of the VCO is frequency divided at a frequency dividing ratio corresponding to the designated linear velocity and is output as reproduction clocks. The gain of the variable gain amplifier which amplifies the phase error signal corresponding to the phase difference between the reproduction clock signal and the clock component in the read signal and uses the amplified signal as a control voltage of the VCO is changed in accordance with the designated linear velocity. Therefore, it is possible to deal with a change in designated linear velocity by a single VCO.

Moreover, a stable loop characteristic is always obtained irrespective of the change in designated linear velocity. Thus, the high data reading speed can be accomplished owing to the realization of the high linear velocity.

What is claimed is:

1. A clock producing PLL circuit for use in a disk playing apparatus which has designating means for designating predetermined linear velocity and reads recorded information from a disk at the linear velocity designated by the designating means, in which a clock signal synchronized in phase with a clock component included in a read signal from the disk is produced and generated as a reproduction clock signal, said PLL circuit comprising:

a voltage controlled oscillator having a predetermined center frequency;

frequency dividing means for frequency dividing an oscillation output of the voltage controlled oscillator at a frequency dividing ratio corresponding to the designated linear velocity and for outputting a divided signal as said reproduction clock signal;

phase comparing means for generating a phase error signal corresponding to a phase difference between the clock component in the reading signal and the reproduction clock signal; and a variable gain amplifier which amplifies the phase error signal and uses an amplified signal as a control voltage of said voltage controlled oscillator and whose gain is variable in accordance with the designated linear velocity.

* * * * *